(12) United States Patent
Matsuda

(10) Patent No.: US 9,356,227 B2
(45) Date of Patent: May 31, 2016

(54) METHOD FOR MANUFACTURING A PIEZOELECTRIC ELEMENT

(71) Applicant: SEIKO EPSON CORPORATION, Tokyo (JP)

(72) Inventor: Hiroshi Matsuda, Gifu (JP)

(73) Assignee: Seiko Epson Corporation, Tokyo (JP)

( * ) Notice: Subject to any disclaimer, the term of this patent is extended or adjusted under 35 U.S.C. 154(b) by 247 days.

(21) Appl. No.: 14/072,913

(22) Filed: Nov. 6, 2013

(65) Prior Publication Data

US 2014/0059821 A1    Mar. 6, 2014

Related U.S. Application Data

(62) Division of application No. 13/042,729, filed on Mar. 8, 2011, now Pat. No. 8,604,668.

(30) Foreign Application Priority Data

Mar. 11, 2010  (JP) .................................. 2010-054168
Dec. 21, 2010  (JP) .................................. 2010-284662

(51) Int. Cl.
  *H04R 17/00*   (2006.01)
  *H01L 41/27*   (2013.01)
  (Continued)

(52) U.S. Cl.
  CPC . *H01L 41/27* (2013.01); *B06B 1/06* (2013.01); *H01L 41/0475* (2013.01); *H01L 41/0815* (2013.01); *H01L 41/0973* (2013.01); *Y10T 29/42* (2015.01)

(58) Field of Classification Search
  CPC .............. H01L 41/047; H01L 41/0973; H01L 41/0986; H01L 41/0815; H01L 41/27; H01L 41/273; H01L 41/277; H01L 41/312; H01L 41/332; Y10T 29/42; Y10T 29/49005; Y10T 29/4908
  USPC .................. 29/25.35, 592.1, 594, 602.1, 609, 29/609.1; 310/324, 328, 330, 331, 335, 310/348
  See application file for complete search history.

(56) References Cited

U.S. PATENT DOCUMENTS 5,698,931 A     12/1997  Shibata et al.
6,256,849 B1 *   7/2001  Kim ........................ B41J 2/161
                                                      216/27

(Continued)

FOREIGN PATENT DOCUMENTS

JP    2003-284182 A    10/2003
JP    2006-229901 A     8/2006

(Continued)

*Primary Examiner* — Paul D Kim
(74) *Attorney, Agent, or Firm* — Global IP Counselors, LLP

(57) ABSTRACT

A piezoelectric element includes a support body having a displacing part capable of undergoing displacement, a lower electrode layer having a lower main electrode body and a lower electrode wire part with the lower main electrode body being formed on the support body and provided within the displacing part in a plan view and the lower electrode wire part being connected to the lower main electrode body and provided across an interior and an exterior of the displacing part, a first piezoelectric layer provided on the lower main electrode body, an upper electrode layer provided across the interior and exterior of the displacing part with at least a part of the upper electrode layer being layered on the first piezoelectric layer and insulated from the lower electrode layer, and a second piezoelectric layer provided on the support body to cover at least a part of the lower electrode wire part.

1 Claim, 12 Drawing Sheets

(51) Int. Cl.
*B06B 1/06* (2006.01)
*H01L 41/08* (2006.01)
*H01L 41/09* (2006.01)
*H01L 41/047* (2006.01)

(56) References Cited

U.S. PATENT DOCUMENTS

| | | | |
|---|---|---|---|
| 6,584,660 | B1 | 7/2003 | Shimogawa et al. |
| 6,949,869 | B2 * | 9/2005 | Junhua ................ B41J 2/14233 310/328 |
| 6,975,183 | B2 * | 12/2005 | Aigner ................ H03H 9/0095 29/25.35 |
| 7,242,130 | B2 | 7/2007 | Nakamura et al. |
| 7,466,064 | B2 | 12/2008 | Sugiura et al. |
| 8,508,315 | B2 * | 8/2013 | Jamneala ............... H03H 9/587 310/334 |
| 8,585,188 | B2 * | 11/2013 | Ohta .................... B41J 2/14233 310/323.06 |
| 2005/0253670 | A1 | 11/2005 | Song et al. |
| 2010/0095497 | A1 | 4/2010 | Park et al. |

FOREIGN PATENT DOCUMENTS

| | | |
|---|---|---|
| JP | 2007-037006 A | 2/2007 |
| JP | 2010-147658 A | 7/2010 |

* cited by examiner

METHOD FOR MANUFACTURING A PIEZOELECTRIC ELEMENT

CROSS-REFERENCE TO RELATED APPLICATIONS

This is a divisional application of U.S. patent application Ser. No. 13/042,729, now U.S. Pat. No. 8,604,668, which claims priority to Japanese Patent Application No. 2010-054168 filed on Mar. 11, 2010 and Japanese Patent Application No. 2010-284662, filed on Dec. 21, 2010. The entire disclosures of Japanese Patent Application Nos. 2010-054168 and 2010-284662 are hereby incorporated herein by reference.

BACKGROUND

1. Technical Field

The present invention relates to a piezoelectric element in which a piezoelectric body is formed on a thin film, a piezoelectric sensor provided with the piezoelectric element, an electronic device, and a method for manufacturing a piezoelectric element.

2. Related Art

Conventionally, there have been known piezoelectric elements (i.e., ultrasound elements) in which piezoelectric bodies are layered on supporting films and the piezoelectric bodies are subjected to a voltage and caused to vibrate, whereby the supporting films are caused to vibrate and ultrasound is produced (e.g., see Japanese Laid-Open Patent Application Publication No. 2006-229901).

The ultrasound element according to Japanese Laid-Open Patent Application Publication No. 2006-229901 is provided with a piezoelectric vibrator in which a piezoelectric thin film is sandwiched by metal electrode films on a membrane. According to an ultrasound element of such description, a voltage is applied on an upper-layer and a lower-layer metal electrode film, whereby the piezoelectric thin film is caused to vibrate, the membrane on which the piezoelectric thin film is formed is also caused to vibrate, and ultrasound is produced.

SUMMARY

In an instance in which an ultrasound element such as that shown in Japanese Laid-Open Patent Application Publication No. 2006-229901 is manufactured, generally, a lower-layer metal electrode film is formed on the membrane, and a piezoelectric thin film is formed on a layer above the lower-layer film; then, the piezoelectric thin film is subjected to an etching treatment and thereby patterned to a predetermined shape. Similarly, when an upper-layer metal electrode film is formed, the metal electrode film is formed on a layer above the lower-layer metal electrode film and piezoelectric thin film, and the metal electrode film is subjected to etching treatment and thereby patterned to a predetermined shape. However, according to a method of such description in which etching is repeatedly performed, during etching of the piezoelectric thin film and during etching of the upper-layer metal electrode film, the lower-layer metal electrode film is also subjected to etching (i.e., over-etching), and the film thickness dimension of the lower-layer metal electrode film is reduced. Thus, when the film thickness dimension of the metal electrode film is reduced, the electrical resistance is increased, and problems are presented in that, for example, electricity consumption is increased, the sound pressure of the ultrasound output is reduced, and control in a high-frequency region becomes difficult.

In view of the above-mentioned problems, an object of the present invention is to provide a piezoelectric element, a piezoelectric sensor, an electronic device, and a method for manufacturing the piezoelectric element, in which the electrical resistance of an electrode can be reduced.

A piezoelectric element according to a first aspect includes a support body, a lower electrode layer, a first piezoelectric layer, an upper electrode layer and a second piezoelectric layer. The support body having a displacing part that is capable of undergoing displacement in a thickness direction. The lower electrode layer has a lower main electrode body and a lower electrode wire part, the lower main electrode body being provided on the support body in a region inside an outer peripheral edge of the displacing part in a plan view when the support body is viewed in the thickness direction of the displacing part, and the lower electrode wire part being connected to the lower main electrode body and provided across a region outside and the region inside the outer peripheral edge of the displacing part. The first piezoelectric layer is provided on the lower main electrode body in the region inside the outer peripheral edge of the displacing part in the plan view. The upper electrode layer is provided across the region outside and the region inside the outer peripheral edge of the displacing part in the plan view, at least a part of the upper electrode layer being layered on the first piezoelectric layer and insulated from the lower electrode layer. The second piezoelectric layer is provided on the support body to cover at least a part of the lower electrode wire part.

According to an example of a configuration of the support body having the displacing part of the above described aspect of the present invention, a through-hole, a recess, or another opening part is formed on, e.g., a substrate, and a supporting film is formed so as to block the opening part, thereby forming a displacing part in which the supporting film on the opening part is capable of being displaced along a direction of the film thickness. According to another possible configuration, the displacing part is held on the opening part such as that described above formed on the substrate, with a bridging part interposed therebetween. Another possible configuration is a displacing part in which, e.g., a concave groove is formed on the support body, and a bottom part of the concave groove is capable of being displaced in a thickness direction. According to another possible configuration, a through-hole, a concave groove, or another opening part is formed on a substrate; an elastic member that has a larger elasticity and deflects more readily than the substrate is joined to the opening part; and the elastic member is allowed to undergo displacement. Other possible configurations of the displacing part include one in which the entirety of the outer peripheral edge of the displacing part is held, or the outer peripheral edge is held at equally spaced intervals, to a main body portion of the support body so that the amount of displacement of a center point is maximized; or one in which one end part of the displacing part is held to the main body portion of the support body so that the amount of displacement of another end part is maximized.

In this aspect, the first piezoelectric layer is layered on the lower main electrode body of the lower electrode layer, and the second piezoelectric layer is layered on at least a part of the lower electrode wire part of the lower electrode layer. The lower electrode layer is thereby covered by the first piezoelectric layer or the second piezoelectric layer, making it possible to prevent the lower electrode layer from being subjected to over-etching during formation of the piezoelectric layer or the upper electrode layer of the piezoelectric element, inhibit any increase in the electrical resistance of the lower electrode layer, and provide a piezoelectric element having a low electrical resistance. In a piezoelectric element having a low electrical resistance of such description, when a voltage is applied between the lower electrode layer and the upper electrode layer and the displacing part is caused to vibrate, a vibration having a large vibration width can be obtained using a low voltage, and a contribution towards reducing energy consumption can be made. Also, in an instance in which the amount of displacement of the supporting film is measured from the size of an electrical current produced by the first piezoelectric layer, a low electrical resistance in the lower electrode wire part makes it possible to inhibit loss of electrical current produced by the first piezoelectric layer and to detect the displacement of the supporting film to a high degree of accuracy.

Although the lower electrode layer may be formed so as to have a large initial thickness dimension in order to account for over-etching of the lower electrode layer as described above, a problem is presented in such an instance in that a portion on which the piezoelectric layer is formed as a layer is not subjected to over-etching, and the thickness dimension of the lower electrode layer is therefore increased, and the total thickness dimension of a portion in which the piezoelectric layer and the upper electrode layer are layered is increased. In contrast, in this aspect of the present invention, it is possible to set the film thickness dimension of the lower electrode layer without having to account for increased electrical resistance or uneven film thickness caused by over-etching of the lower electrode layer, and to reduce the thickness of the piezoelectric element.

It is also possible to form the second piezoelectric layer, formed from the same material as the first piezoelectric layer, on the lower electrode wire part. In such an instance, the second piezoelectric layer can be formed at the same time as the first piezoelectric layer. Therefore, compared to an instance in which a protective layer or another layer for protecting the lower electrode wire part is separately used, the piezoelectric element can be manufactured in a simpler manner, and the manufacturing cost can be reduced.

According to the piezoelectric element as described above, the second piezoelectric layer is preferably formed at a position that does not overlap with the outer peripheral edge of the displacing part in the plan view.

In an instance in which the displacing part is caused to displace in coordination with the vibration of the first piezoelectric layer, or in an instance in which the displacing part is caused to displace due to an external stress, forming the edge part of the displacing part so as to have a small film thickness dimension makes it possible to increase the amount of displacement of the displacing part. In this aspect of the present invention, since the second piezoelectric layer is provided at a position that does not overlap with the edge part of the displacing part, the thickness dimension of the displacing part near the edge part does not increase. Therefore, even in an instance in which the displacing part is caused to displace due to vibration of the first piezoelectric layer, or in an instance in which the displacing part is caused to displace due to an external force, the amount of displacement of the displacing part can be increased. Therefore, in an instance in which, e.g., the displacing part is caused to vibrate and ultrasound is produced, the width of vibration of the displacing part can be increased using a low voltage, and an ultrasound having an even higher sound pressure can be produced, compared to an instance in which, e.g., the second piezoelectric layer is also layered on the edge of the displacing part. Also, in an instance in which ultrasound is received, it is possible to cause the ultrasound that is received to cause a large vibration in the displacing part, and it is therefore possible to increase the reception sensitivity, and to detect the ultrasound to a high degree of accuracy.

The piezoelectric element as described above may further have a wiring layer provided on the second piezoelectric layer. According to this aspect of the present invention, forming the wiring layer on the piezoelectric element makes it possible to separate the wiring layer and the lower electrode layer. In an instance in which a plurality of wiring patterns are formed on the same planar substrate, there is a possibility of the size of the substrate or other factors causing the line width of each of the wiring patterns to be restricted and increasing the electrical resistance. In contrast, in this aspect of the present invention, the wiring layer is also formed on the second piezoelectric layer, thereby making it possible to form a wiring pattern on the substrate and the second piezoelectric layer so as to have a two-layered structure. Therefore, it is possible to reduce the size of the substrate as well as to prevent the electrical resistance from increasing, compared to an instance in which a plurality of wiring patterns are formed on the same substrate.

The wiring layer may provide an electrical connection between two separate points on the lower electrode wire part.

In this aspect, the wiring layer provides an electrical connection between two separate points on the lower electrode layer. Therefore, it is possible to pass an electrical current through each of the lower electrode layer and the wiring layer between the two points on the lower electrode layer, and the electrical resistance can be further reduced.

In the piezoelectric element as described above, it is preferable that the lower electrode wire part includes an element connection wiring, provided across the region inside and the region outside the outer peripheral edge of the displacing part in the plan view, the element connection wiring connecting to the lower main electrode body, and a lower electrode wiring provided in the region outside the outer peripheral edge of the displacing part in continuation with the element connection wiring, the lower electrode wiring having a smaller width than that of the element connection wiring in the plan view. The second piezoelectric layer preferably covers the lower electrode wiring.

In this aspect, the second piezoelectric layer covers a portion of the lower electrode wire part that is the lower electrode wiring having a small line width.

The electrical resistance of the lower electrode wire part decreases with an increase in the line width dimension. Therefore, the lower electrode wire part is preferably formed so as to have a large line width. However, when the piezoelectric element is actually arranged on the substrate, there are instances in which the lower electrode wiring cannot be provided so as to have a sufficient line width, and the line width is smaller than that of the element connection wiring, owing to other elements and their wiring patterns. In such an instance, if the lower electrode wiring is subjected to over-etching when patterning is performed on the piezoelectric layer or the upper electrode, the resistance of the lower electrode wiring increases. In contrast, according to this aspect of the present invention, the second piezoelectric layer is layered on the lower electrode wiring having a smaller line width as described above. Therefore, the lower electrode wiring is not subjected to over-etching when patterning is performed on the piezoelectric layer or the upper electrode, and the electrical resistance can be prevented from increasing.

A piezoelectric sensor according to another aspect includes a plurality of the piezoelectric elements of above description, wherein the piezoelectric elements are arranged in an array.

In this aspect of the present invention, the piezoelectric sensor includes a plurality of the piezoelectric elements arranged in an array. As described above, in each of the piezoelectric elements, a part of the lower electrode layer is covered by the second piezoelectric layer, and an increase in electrical resistance due to over-etching can therefore be inhibited. Therefore, in an instance in which, e.g., the supporting film is caused to vibrate and ultrasound is produced, ultrasound having a large sound pressure (i.e., a large vibration width) can be produced with a low power consumption. In an instance in which, e.g., ultrasound is received using the supporting film and an ultrasound signal is detected, a large electrical signal (i.e., a large current) can be outputted, and the detection accuracy can be increased.

In a piezoelectric sensor of such description, a lower electrode wire part for providing a connection with each of the piezoelectric elements is necessary. In an instance in which a small piezoelectric sensor is formed, the line width of each of the lower electrode wire parts is restricted and made smaller. In such an instance, the electrical resistance of each of the lower electrode wire parts increases. In an instance in which the second piezoelectric layer is not formed above the lower electrode wire part, there is a possibility of the lower electrode wire part being subjected to over-etching, thereby increasing the electrical resistance. In contrast, according to this aspect of the present invention, the second piezoelectric layer is also formed on the lower electrode wire part having a small line width as described above, making it possible to prevent the resistance from increasing when the piezoelectric layer and the upper electrode layer are subjected to patterning.

An electronic device according to another aspect includes the piezoelectric element such as that described above or the piezoelectric sensor such as that described above.

According to this aspect, in the piezoelectric element provided to the electronic device, a part of the lower electrode layer is covered by the second piezoelectric layer, and it is possible to inhibit an increase in electrical resistance due to over-etching, drive the displacing part using low electrical power, reduce any loss in an electrical signal from the displacing part, and reduce the thickness of the piezoelectric element, as described above. Therefore, in the electronic device provided with the piezoelectric element as described above or with the piezoelectric sensor installed with the piezoelectric element, it is also possible to drive the displacing part using low electrical power and reduce any loss in an electrical signal from the displacing part, thereby making it possible to reduce power consumption. Also, since the thickness of the piezoelectric element can be reduced, it is possible to contribute towards reducing the size of the electronic device.

A method for manufacturing a piezoelectric element according to another aspect includes: patterning a lower electrode layer on a support body with the support body having a displacing part that is capable of undergoing displacement in a thickness direction, and a lower electrode layer having a lower main electrode body and a lower electrode wire part, the lower main electrode body being provided in a region inside an outer peripheral edge of the displacing part in a plan view when the support body is viewed in the thickness direction of the displacing part, and the lower electrode wire part being connected to the lower main electrode body and provided across a region outside and the region inside the outer peripheral edge of the displacing part; layering on the lower electrode layer a piezoelectric layer including a first piezoelectric layer and a second piezoelectric layer; performing an etching treatment outside a region in which the first piezoelectric layer is to be formed and a region in which the second piezoelectric layer is to be formed, and forming the first piezoelectric layer and the second piezoelectric layer so that the first piezoelectric layer is provided on the lower main electrode body in the region inside the outer peripheral edge of the displacing part in the plan view, and the second piezoelectric layer is provided on the support body so as to cover at least a part of the lower electrode wire part; layering an upper electrode precursor layer; and performing etching and patterning of the upper electrode precursor layer so that the upper electrode layer is provided across the region outside and the region inside the outer peripheral edge of the displacing part in the plan view, at least a part of the upper electrode layer being layered on the first piezoelectric layer and insulated from the lower electrode layer.

According to this aspect, after the lower electrode patterning step, a piezoelectric layer layering step, in which a piezoelectric layer is layered, is performed; the piezoelectric layer being for forming the second piezoelectric layer and the first piezoelectric layer; the second piezoelectric layer covering at least a part of the lower electrode wire part of the lower electrode layer, and the first piezoelectric layer being layered on the lower main electrode body of the lower electrode layer. After the piezoelectric layer layering step, the piezoelectric layer patterning step is performed, wherein the piezoelectric layer is subjected to etching, and the first piezoelectric layer on the lower main electrode body and the second piezoelectric layer covering at least a part of the lower electrode wire part are formed. After the piezoelectric layer patterning step, an upper electrode precursor layer layering step and the upper electrode precursor layer patterning step are performed, and the upper electrode layer is formed while any increase in the electrical resistance of the lower electrode layer is inhibited.

As with the aspects of the invention described above, manufacturing the piezoelectric element according to the manufacturing method described above makes it possible to inhibit any increase in the electrical resistance of the lower electrode layer. Also, since it is possible to form the first piezoelectric layer and the second piezoelectric layer at the same time, the manufacturing process can be made simpler compared to a method in which, e.g., a protective film for protecting the lower electrode layer is separately formed.

BRIEF DESCRIPTION OF THE DRAWINGS

Referring now to the attached drawings which form a part of this original disclosure:

FIG. 9A is a plan view and FIG. 9B is a cross-section view;

DETAILED DESCRIPTION OF EXEMPLARY EMBODIMENTS

First Embodiment

A configuration of a piezoelectric element according to a first embodiment of the present invention will now be described with reference to the accompanying drawings.

Configuration of Piezoelectric Element

Figure 1:
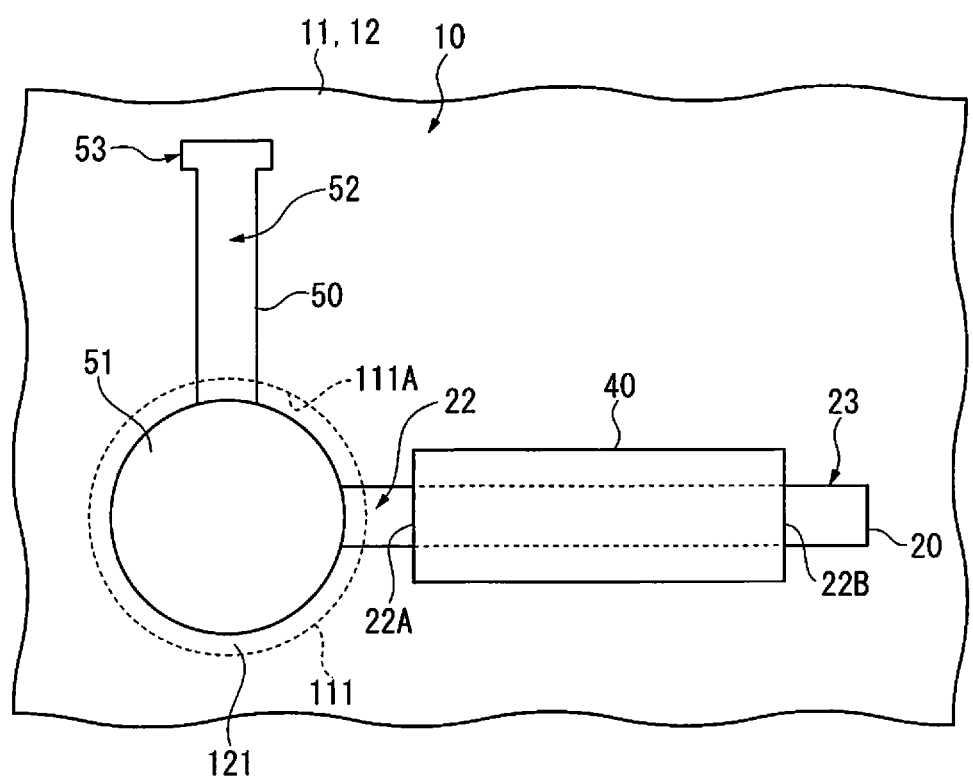
FIG. 1 is a plan view of a piezoelectric element according to a first embodiment of the present invention.

FIG. 1 is a plan view of a piezoelectric element according to the first embodiment.

Figure 2:
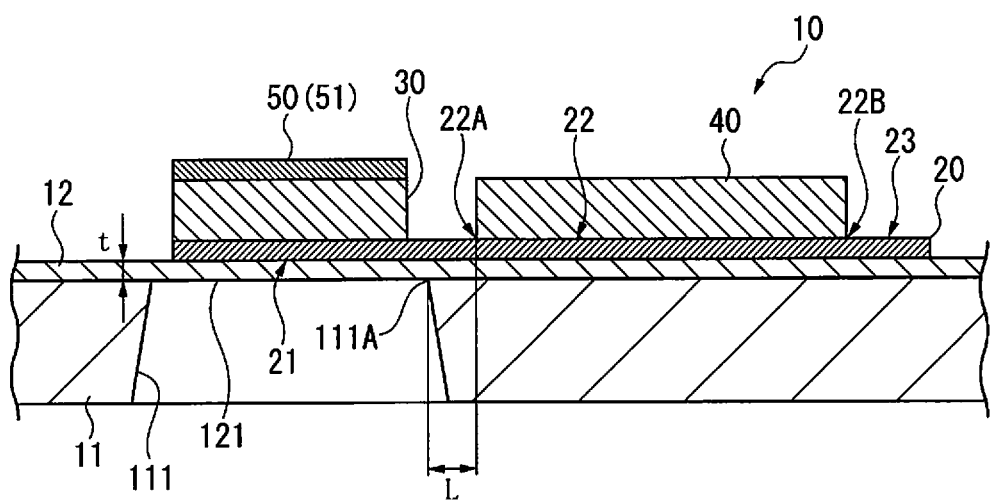
FIG. 2 is a cross-section view of the piezoelectric element according to the first embodiment.

FIG. 2 is a cross-section view of the piezoelectric element according to the first embodiment.

In FIG. 1, a piezoelectric element 10 comprises a substrate 11 on which an opening part 111 is formed; a supporting film 12 formed on the substrate 11 across an interior and an exterior of the opening part 111; a lower electrode layer 20 formed on the supporting film 12; a first piezoelectric layer 30 formed on an inside of the opening part 111; a second piezoelectric layer 40 formed on an outside of the opening part 111; and an upper electrode layer 50 formed across the interior and the exterior of the opening part 111. The substrate 11 and the supporting film 12 form a support body of the present invention. A membrane 121, which is a region of the supporting film 12 that blocks the opening part 111, forms a displacing part of the present invention.

The present embodiment shows an example in which the supporting film 12 is formed on the substrate 11 having an opening part 111, which is a through-hole; and the support body is provided with a membrane 121, which is the displacing part. However, the present embodiment is not limited to that described above. According to an example of another possible configuration, the opening part 111 is a concave groove, wherein the supporting film 12 blocks an opening of the concave groove opening part 111. Another possible configuration is a support body in which a concave groove is formed on the substrate 11 and a bottom part of the concave groove forms the displacing part.

Also, although there is shown an example in which the support body is formed from the substrate 11 and the 12, according to another possible configuration, an insulating film or another layer is provided on a layer above the supporting film 12, and the lower electrode layer 20 is provided on the other layer.

The piezoelectric element 10 can be used as, e.g., an ultrasound transmission element in which a voltage is applied to the first piezoelectric layer 30, thereby causing the supporting film 12 to vibrate and ultrasound to be outputted; an ultrasound reception element in which the supporting film 12 receives ultrasound and the first piezoelectric layer 30 outputs an electrical signal corresponding to vibration; a stress detection element for detecting stress applied to the supporting film 12 according to an electric signal outputted by the first piezoelectric layer 30; or a driving force generation element for driving the first piezoelectric layer 30 and imparting a driving force to a target object that comes into contact with the supporting film 12. In the present embodiment, a description is given for an example in which the piezoelectric element 10 is made to function as an ultrasound transmission element.

The substrate 11 is formed from, e.g., a silicon or another semiconductor-forming material that can be readily machined by, e.g., etching. The opening part 111 formed on the substrate 11 is preferably formed so as to be circular in the plan view. Stress with respect to deflection of the membrane 121, which is a part of the supporting film 12 on the inside of the opening part 111, can thereby be made uniform.

Specifically, in an instance in which, e.g., the opening part 111 is formed so as to be, e.g., rectangular, and the first piezoelectric layer 30 is formed at a center part of the rectangle, the degree to which a region of the supporting film 12 readily undergoes deflection differs from one region of the supporting film 12 to another even at positions at which the respective distance from a center point of the membrane 121 is equal. In contrast, in an instance such as in the present embodiment in which a circular opening part 111 is formed, the distance from the center point of the membrane to an edge part 111A of the opening part 111 (that forms an outer peripheral edge of the displacing part according to the present invention) is uniform. Therefore, points situated at an equal distance from the center point of the membrane 121 have the same degree to which the supporting film 12 readily undergoes deflection, and it is possible to allow the membrane 121 to deflect in a uniform manner.

The supporting film 12 is formed on the substrate 11 so as to block the opening part 111. The supporting film 12 has a two-layered structure comprising, e.g., an $SiO_2$ layer and a $ZrO_2$ layer. In an instance in which the substrate 11 is an Si substrate, the $SiO_2$ layer can be formed by subjecting a surface of the substrate to thermal oxidation treatment. The $ZrO_2$ layer is formed on the $SiO_2$ layer by, e.g., sputtering or another method. The $ZrO_2$ layer is a layer for, e.g., preventing PZT-forming Pb from diffusing into the $SiO_2$ layer in an instance in which PZT is used as the first piezoelectric layer 30 or the second piezoelectric layer 40. The $ZrO_2$ layer also has an effect of improving the deflection efficiency with respect to distortion of the membrane 121.

The lower electrode layer 20 comprises a lower main electrode body 21 formed on the inside of the opening part 111 in the plan view and to which the first piezoelectric layer 30 is layered on a layer above; a lower electrode wire part 22 formed in continuation from the lower main electrode body 21 across an interior and an exterior of a region surrounded by the edge part 111A of the opening part 111, the first piezoelectric layer 30 not being layered on the lower electrode wire part 21; and a lower electrode terminal part 23 formed at a distal end part of the lower electrode wire part 22. Specifically, the lower electrode wire part 22 is formed across a region inside to a region outside the edge part 111A on the membrane 121.

The first piezoelectric layer 30 is formed as a layer on the lower main electrode body 21 of the lower electrode layer 20. Formation of the first piezoelectric layer 30 is performed by forming, e.g., PZT (lead zirconate titanate) into the shape of a film. Although PZT is used as the first piezoelectric layer 30 in the present embodiment, any material may be used as long as the material is capable of contracting in an in-plane direction under an impressed voltage. For example, lead titanate ($PbTiO_3$), lead zirconate ($PbZrO_3$), or lead lanthanum titanate (($Pb$, $La$)$TiO_3$) may be used.

The first piezoelectric layer 30 is subjected to a voltage applied to the lower main electrode body 21 and the upper electrode layer 50 described further below, thereby causing the first piezoelectric layer 30 to contract in the in-plane direction. One surface of the first piezoelectric layer 30 is joined to the supporting film 12 with the lower main electrode body 21 interposed therebetween. However, on another surface, although the upper electrode layer 50 is formed, no other layers are formed on the upper electrode layer 50. Therefore, the first piezoelectric layer 30 does not readily contract on a side towards the supporting film 12, and readily contracts on a side towards the upper electrode layer 50. Therefore, when a voltage is applied to the first piezoelectric layer 30, a convex deflection is formed on a side towards the opening part 111, causing the membrane 121 to be deflected. Therefore, adding an AC current to the first piezoelectric layer 30 causes the membrane 121 to vibrate in a film thickness direction, and the vibration of the membrane 121 causes ultrasound to be outputted from the opening part 111.

The upper electrode layer 50 is patterned into a positional arrangement where a part of the upper electrode layer 50 is layered on the first piezoelectric layer 30 in the plan view and insulated from the lower electrode layer 20. Specifically, the upper electrode layer 50 comprises an upper main electrode body 51 layered on the first piezoelectric layer 30; an upper electrode wire part 52 formed in continuation from the upper main electrode body 51 across the interior and the exterior of the opening part 111 in the plan view and extending in a different direction to the lower electrode wire part 22; and an upper electrode terminal part 53 formed at a distal end part of the upper electrode wire part.

A region of the first piezoelectric layer 30 that overlaps with both of the upper electrode layer 50 and the lower main electrode body 21 represents a region that contracts under application of a voltage.

The second piezoelectric layer 40 is formed from PZT, which is the same material as that used for the first piezoelectric layer 30. The second piezoelectric layer 40 is formed at a region further outwards from the opening part 111 of the supporting film 12 so as to cover the lower electrode wire part 22 of the lower electrode layer 20. Specifically, the second piezoelectric layer 40 is formed so as to cover a portion of the lower electrode wire part 22 between an end part position 22A, which is separated from the edge part 111A of the opening part 111 on the supporting film 12 by a predetermined distance at which the deflection of the membrane 121 is not affected, and a part 22B where a connection is present between the lower electrode terminal part 23 and the lower electrode wire part 22. The end part position 22A is separated from the edge part 111A by a predetermined distance because in an instance in which the second piezoelectric layer 40 is formed so as to overlap the edge part 111A of the opening part 111, the membrane 121 increases in stiffness with respect to deflection, and the sound pressure of the ultrasound output decreases. Further preferably, the second piezoelectric layer 40 is formed on a portion of the lower electrode wire part 22 between an end part position 22A, at which the distance L from the opening part 111A of the opening part 111 satisfies the following equation (1) when t represents the thickness dimension of the supporting film 12, and the connecting part 22B.

Equation (1)

$$L > 5t \quad (1)$$

This is because when the membrane 121 of the supporting film 12 undergoes deflection, a moment is generated in the supporting film 12 so that the arm part 12 moves into the opening part 111. The moment causes a portion of the supporting film within a distance of 5t from the edge part 111A of the opening part 111 in the plan view to be subjected to a tensile force. Therefore, if the second piezoelectric layer 40 is formed within the distance range, a resistance is generated when the membrane 121 undergoes deflection, and the sound pressure of the ultrasound is reduced. In contrast, the effect described above does not occur at a distance at or greater than 5t from the edge part 111A of the opening part 111 in the plan view, and it is possible to cause the membrane 121 to deflect to a sufficient degree. In contrast, if the position at which an end part of the second piezoelectric layer 40 is formed is too far from the opening part 111, the area of exposure of the lower electrode wire part 22 is larger. Therefore, when the first and second piezoelectric layers 30, 40 are being patterned, and when the upper electrode layer 50 is being patterned, the exposed portion of the lower electrode wire part 22 may be subjected to over-etching, and electrical resistance may be increased. Therefore, most preferably, the second piezoelectric layer 40 is formed at a position so as to cover the lower electrode wire part 22 between a location separated from the edge part 111A of the opening part 111 by a distance of 5t and the part 22B where a connection is present between the lower electrode terminal part 23 and the lower electrode wire part 22.

The second piezoelectric layer 40 is not formed on the lower electrode terminal part 23, because wiring for applying a voltage to the first piezoelectric layer 30 is connected to the lower electrode terminal part 23.

Method for Manufacturing Piezoelectric Element

A method for manufacturing a piezoelectric element as described above will now be described with reference to the accompanying drawings.

FIGS. 3 and 4 are cross-section views showing a process for manufacturing the piezoelectric element.

Figure 3A:
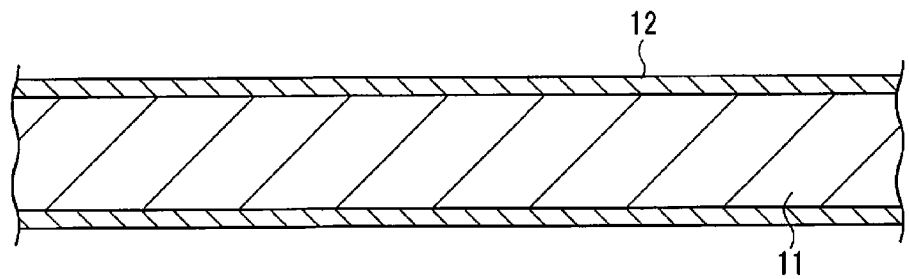
FIGS. 3A to 3D are cross-section views showing a part of a process for manufacturing the piezoelectric element.

In order to manufacture the piezoelectric element 10, first, as shown in FIG. 3A, the substrate 11 (Si) is subjected to thermal oxidation treatment, and an $SiO_2$ layer is formed on a surface of the substrate 11. A Zr layer is sputtered on the $SiO_2$ layer, and caused to oxidize, whereby a $ZrO_2$ layer is formed. The supporting film 12 having a thickness dimension of, e.g., 3 μm is thereby formed.

Next, the lower electrode layer 20 is formed on one surface side of the substrate 11 by, e.g., sputtering. There are no specific limitations on the material used for the lower electrode layer 20 as long as the film is electroconductive. In the present embodiment, a Ti/Ir/Pt/Ti multilayer structure film is used, and the lower electrode layer 20 is uniformly formed so that the film thickness is, e.g., 0.2 μm after the piezoelectric layer is baked.

Figure 3B:
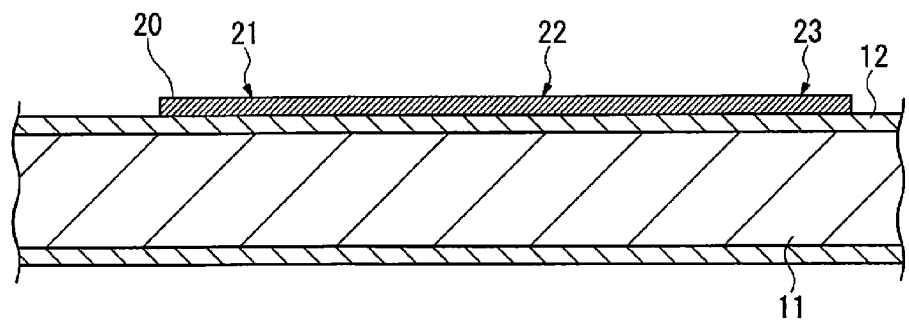

Then, using, e.g., photolithography, a resist is formed on the lower electrode layer 20 at a position at which the lower main electrode body 21 and the lower electrode wire part 22 are to be formed. Next, patterning is performed by removing, using etching, a region of the lower electrode layer at which the resist has not been formed, and the lower main electrode body 21, the lower electrode wire part 22, and the lower electrode terminal part 23 are formed as shown in FIG. 3B (i.e., lower electrode patterning step).

Figure 3C:
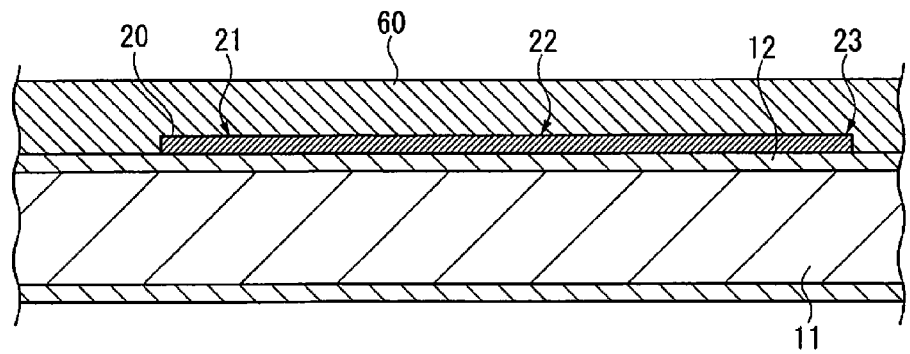

Next, as shown in FIG. 3C, a piezoelectric layer 60 formed from PZT is formed as a layer on one surface of the substrate 11 where the lower electrode layer 20 has been patterned. In the formation of the piezoelectric layer 60, MOD (metal organic decomposition) is used, and twelve layers of film are formed so that the total thickness dimension is, e.g., 1.4 μm (i.e., piezoelectric layer layering step).

Figure 3D:
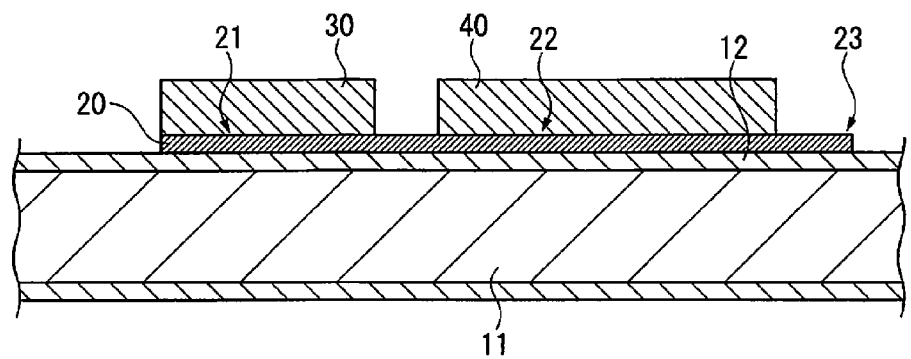

Then, using, e.g., photolithography, a resist is formed on the piezoelectric layer 60 at a position at which the first piezoelectric layer 30 and the second piezoelectric layer 40 are to be formed, and patterning is performed by removing, using etching, a region at which the resist has not been formed. The first piezoelectric layer 30 is thereby formed on the lower main electrode body 21, and the second piezoelectric layer 40 is formed on the lower electrode wire part 22, as shown in FIG. 3D (i.e., piezoelectric layer patterning step).

During the piezoelectric layer patterning step, the lower electrode layer 20 is not subjected to etching at regions at which the first piezoelectric layer 30 and the second piezoelectric layer 40 are to be formed. Therefore, disadvantages such as an increase in electrical resistance do not occur.

When the piezoelectric layer 60 is subjected to etching, over-etching may occur on a portion of the lower electrode wire part 22 formed in a region on the opening part 111 in which the first piezoelectric layer 30 is not provided, and on a portion of the lower electrode wire part 22 within a range of distance L of 5t from the edge part 111A of the opening part 111 (in the present embodiment, since t=3 μm, L=15 μm). Nevertheless, since the portions subjected to over-etching represent an extremely small range relative to the entirety of the lower electrode wire part 22, even when the electrical resistance in these portions increases, there are no significant effects.

Figure 4A:
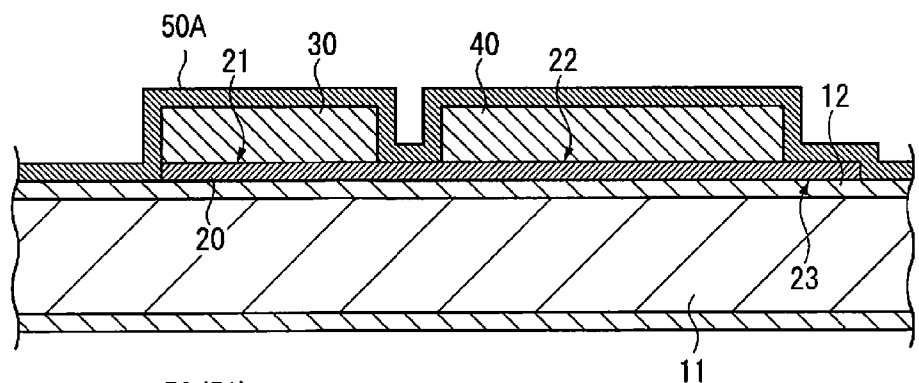
FIGS. 4A to 4D are cross-section views showing a remaining part of the process for manufacturing the piezoelectric element.

Next, as shown in FIG. 4A, the upper electrode precursor layer 50A is uniformly formed on one surface of the substrate 11 by, e.g., by sputtering. As with the lower electrode layer 20, any material having electroconductivity may be used for an electroconductive film forming the upper electrode precursor layer 50A; however, in the present embodiment, an Ir film is used, and is formed so that the thickness dimension is, e.g., 50 nm (i.e., upper electrode precursor layer layering step).

Figure 4B:
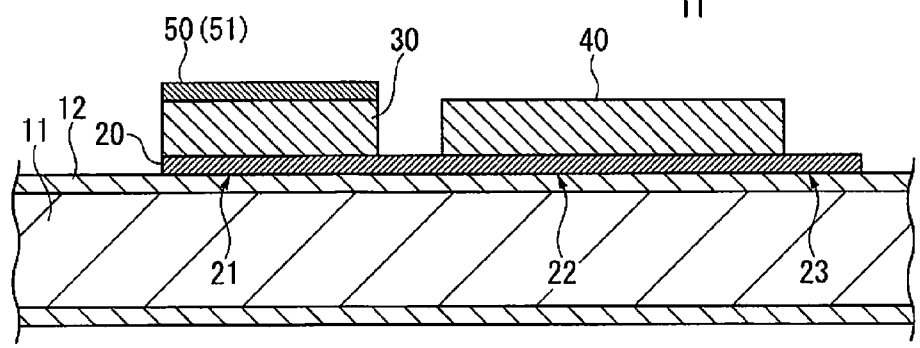

Then, using, e.g., photolithography, a resist for patterning of the upper main electrode body 51, the upper electrode wire part 52, and the upper electrode terminal part 53 is formed on the upper electrode precursor layer 50A, and patterning is performed by removing, using etching, a region at which the resist has not been formed. Thereby the upper electrode layer 50 is formed as shown in FIG. 4B (i.e., upper electrode patterning step).

During the upper electrode patterning step, as with the piezoelectric layer patterning step, the lower electrode layer 20 is covered by the first piezoelectric layer 30 and the second piezoelectric layer 40, over-etching of the lower electrode layer 20 is therefore prevented, and the electrical resistance of the lower electrode layer 20 can be prevented from increasing.

Figure 4C:
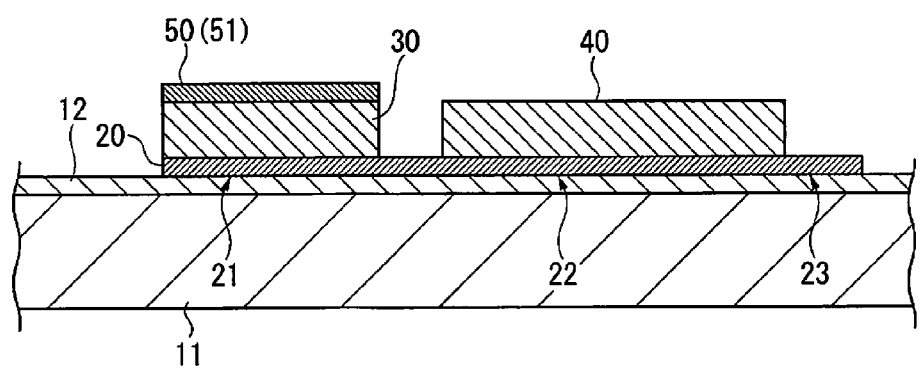

Next, the thickness dimension of the substrate 11 is adjusted. As shown in FIG. 4C, another surface of the substrate 11 (i.e., a surface on which ultrasound is outputted) is subjected to, e.g., polishing or cutting, or otherwise machined, the another surface of the substrate 11 being disposed opposite one surface on which the lower electrode layer 20, the first piezoelectric layer 30, the second piezoelectric layer 40, or the upper electrode layer 50 are formed. Performing cutting or polishing as described above makes it possible to reduce the amount of etching required when the opening part tills formed. The substrate 11 is formed by RIE (reactive ion etching) using an ICP (inductive coupled plasma) etching device. It is preferable that the cutting and/or polishing is performed so that the thickness dimension of the substrate 11 is 200 μm, accounting for the depth dimension to which etching is performed, stiffness with respect to warpage under membrane stress, and strength under handling.

Figure 4D:
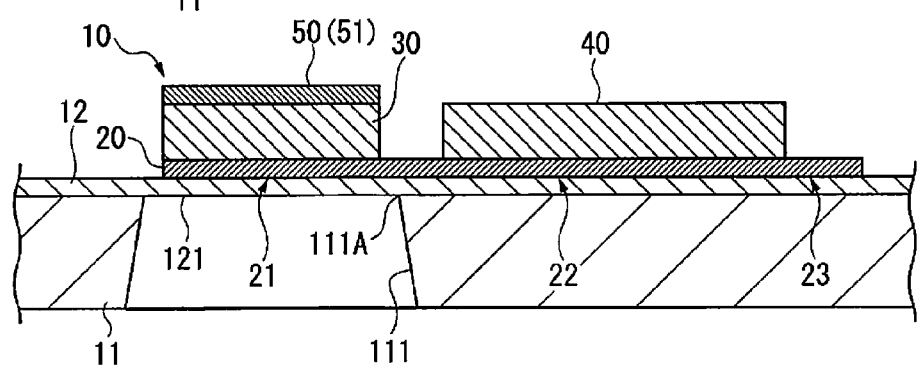

In order to form the opening part 111, a resist is formed on the another surface of the substrate 11 at locations other than the position at which the opening part 111 is to be formed. The resist is formed to a thickness of, e.g., 10 μm so as to be capable of withstanding etching of the substrate 11. Then, as shown in FIG. 4D, an ICP etching device is used to perform etching on the substrate II from the other surface side to the SiO$_2$ layer in the supporting film 12.

The piezoelectric element 10 is thereby manufactured.

Operation and Effect of First Embodiment

As described above, in the piezoelectric element according to the first embodiment, the first piezoelectric layer 30 is formed on the lower main electrode body 21, which is a portion of the lower electrode layer 20 formed across the interior and exterior of the opening part 111 that is formed inside the opening part 111, and the second piezoelectric layer 40 is formed on a portion of the lower electrode wire part 22 that is outside the opening part 111.

Therefore, it is possible to prevent the disadvantage of the lower electrode layer being over-etched and the electrical resistance increasing when etching is performed on the piezoelectric layer 60 and the first piezoelectric layer 30 and the second piezoelectric layer 40 are being formed. Accordingly, the amount of expansion and contraction of the first piezoelectric layer 30 can be increased using a lower electrical power, and the sound pressure of the ultrasound produced by vibration of the membrane 121 can be increased.

Also, there is no need to take over-etching into account and increase the thickness dimension of the lower electrode layer 20, and the thickness dimension of the lower electrode layer 20 can be reduced. Therefore, the piezoelectric element 10 itself can be made thinner.

Also, the first piezoelectric layer 30 and the second piezoelectric layer 40 are formed from the same material, PZT. Specifically, the first piezoelectric layer 30 and the second piezoelectric layer 40 can be formed simultaneously using the piezoelectric layer layering step and the piezoelectric layer patterning step. Compared to an instance in which, e.g., another protective film is provided on the lower electrode layer 20, the manufacturing process can thereby be made simpler, and the configuration can be simplified without the need to separately ready a protective film.

Also, the second piezoelectric layer 40 is formed at a position that does not overlap with the edge part 111A of the opening part 111 in the plan view.

Therefore, the second piezoelectric layer 40 does not generate a resistance when the membrane 121 undergoes deflection. Accordingly, compared to an instance in which the second piezoelectric layer 40 is formed on the edge part 111A of the opening part 111, the membrane 121 can be made to vibrate so as to have a larger vibration width. Therefore, even in an instance in which the voltage applied to the first piezoelectric layer 30 is low, it is possible to output ultrasound having a large sound pressure.

The second piezoelectric layer 40 is formed so as to cover a portion of the lower electrode wire part 22 between the end part position 22A, which is separated from the opening part 111A of the opening part 111 by a distance L that is five times longer than the thickness dimension t of the supporting film 12, and the part 22B where a connection is present between the lower electrode terminal part 23 and the lower electrode wire part 22.

When the membrane 121 undergoes deflection, the supporting film 12 is subjected to a moment in a direction of entering the opening part 111. Therefore, a portion of the supporting film 12 near the edge part 111A of the opening part 111 is subjected to a tensile force towards the opening part III and is made to expand and contract. In an instance in which the second piezoelectric layer 40 is formed at a position near the edge part of the opening part 111, the expansion and contraction of the portion of the supporting film 12 is restricted, and there is a possibility of the amount of deflection of the membrane 121 being restricted. In contrast, by forming the second piezoelectric layer 40 at a position separated by the distance L from the edge part 111A of the opening part 111 as described above, the deflection resistance of the membrane 121 does not increase, and the amount of deflection of the membrane 121 does not decrease. Therefore, compared to an instance in which the distance between the edge part 111A of the opening part 111 and a position at which the second piezoelectric layer 40 is formed is less than the distance L, ultrasound having a higher sound pressure can be produced.

Second Embodiment

Next, a piezoelectric element according to the second embodiment of the present invention will be described with reference to the accompanying drawings.

Figure 5:
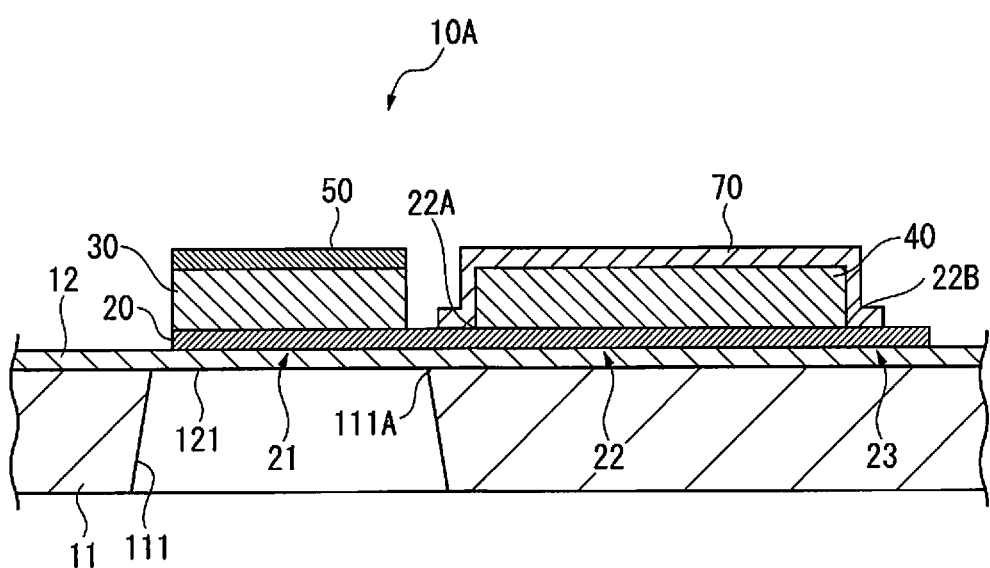
FIG. 5 is a cross-section view of a piezoelectric element according to a second embodiment of the present invention.

FIG. 5 is a cross-section view of the piezoelectric element according to the second embodiment of the present invention.

In the piezoelectric element 10A according to the second embodiment, an auxiliary electrode layer 70, which is a wiring layer, is formed on the second piezoelectric layer 40 in the piezoelectric element 10 according to the first embodiment.

Specifically, the auxiliary electrode layer 70 is formed on a layer above the second piezoelectric layer 40 from the connecting part 22B of the lower electrode layer 20, and is made to reconnect with the lower electrode layer 20 at the end part position 22A of the second piezoelectric layer 40.

The auxiliary electrode layer 70 of such description is formed from the same material as the upper electrode layer 50, and is formed simultaneously with the upper electrode layer 50 during the upper electrode patterning step.

Specifically, after the upper electrode precursor layer layering step in which the electroconductive film such as that shown in FIG. 4A is formed, a resist is formed during an upper electrode pattern formation step, the resist being formed in respective positions where the upper electrode layer 50 is to be formed and where the auxiliary electrode layer 70 is to be formed. Then, the electroconductive film outside the regions at which the resist has been formed is removed by etching, whereby the auxiliary electrode layer 70 such as that shown in FIG. 5 is formed.

Operation and Effect of Second Embodiment

According to the piezoelectric element 10A of the second embodiment, it is possible to obtain the same operation and effect as those for the piezoelectric element 10 of the first embodiment, inhibit any increase in electrical resistance of the lower electrode layer 20, and contribute towards reducing the thickness of the piezoelectric element 10A itself.

Also, providing the auxiliary electrode layer 70 makes it possible to further reduce electrical resistance in a wiring portion between the lower electrode terminal part 23 and the lower main electrode body 21, and to drive the first piezoelectric layer 30 and produce ultrasound using an even lower voltage.

Also, although the piezoelectric element 10A in FIG. 5 shows a configuration in which an end part of the auxiliary electrode layer 70 is positioned further outwards relative to the edge part 111A of the opening part 111, the configuration is not limited to that shown. According to an example of another possible configuration, the auxiliary electrode layer 70 is also formed on a portion of the lower electrode wire part 22 between the end part position 22A of the second piezoelectric layer 40 and the first piezoelectric layer 30. As described above, the upper electrode layer 50 is a layer formed to a sufficiently smaller thickness compared to the second piezoelectric layer 40, the upper electrode layer 50 being formed so as to have a thickness dimension of, e.g., 50 nm. The auxiliary electrode layer 70, which is formed at the same time as the upper electrode layer 50, is formed so as to have a thickness dimension that is equal to that of the upper electrode layer 50. Therefore, even if the auxiliary electrode layer 70 of such description is formed across the interior and the exterior of the opening part 111, the effect on the deflection of the membrane is negligible, and the sound pressure of the ultrasound is not reduced as a result. Also, in an instance in which the auxiliary electrode layer 70 is thus formed on the lower electrode wire part 22 between the end part position 22A of the second piezoelectric layer 40 and the first piezoelectric layer 30, the auxiliary electrode layer 70 layered on the lower electrode wire part 22 makes it possible to inhibit an increase in electrical resistance, even in an instance in which the lower electrode wire part 22 between the end part position 22A of the second piezoelectric layer 40 and the first piezoelectric layer 30 is subjected to over-etching during the piezoelectric layer patterning step or the upper electrode patterning step. Therefore, the electrical resistance can be prevented from increasing in a more efficient manner, and ultrasound having a high sound pressure can be produced using a low voltage.

Similarly, the auxiliary electrode layer 70 may be formed on the lower electrode terminal part 23. In such an instance, the electrical resistance in the lower electrode terminal part 23 can be prevented from increasing.

Example of Modification of Second Embodiment

Although the example of the second embodiment described above shows, as a wiring layer, an auxiliary electrode layer 70 for providing a connection between two points on the lower electrode layer 20 (i.e., between the end part position 22A and the connecting part 22B), the configuration is not limited to that described above. A configuration shown in FIGS. 6, 7, and 8 is also possible.

Figure 6:
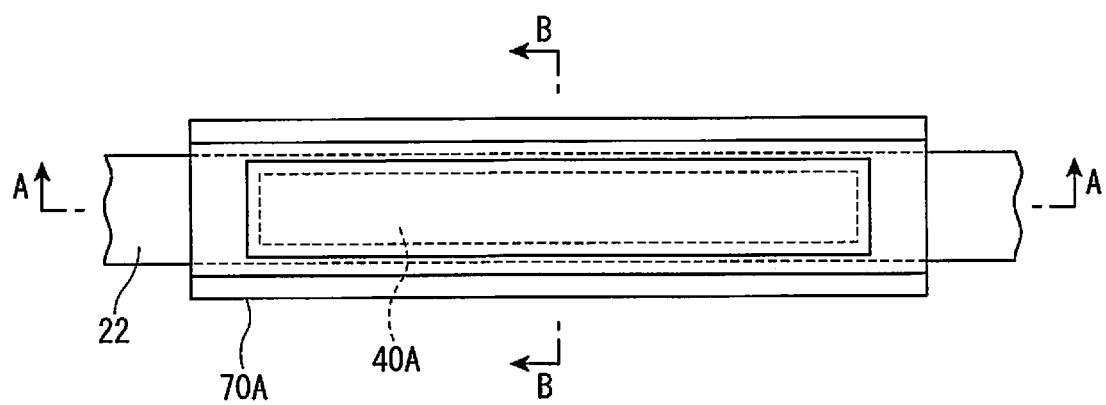
FIG. 6 is a plan view of a lower electrode wire part of the piezoelectric element according to an example of a modification of the second embodiment, viewed from a thickness direction of the substrate.
Figure 7:
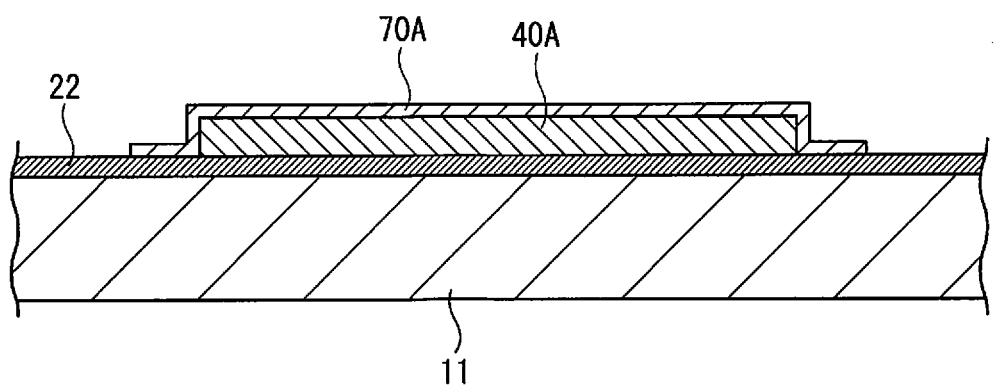
FIG. 7 is a cross-section view along line A-A in FIG. 6.

FIG. 6 is a plan view of a part of a lower electrode wire part 22 of a piezoelectric element according to an example of a modification of the second embodiment, viewed from the thickness direction of the substrate 11. FIG. 7 is a cross-section view along line A-A in FIG. 6.

Figure 8:
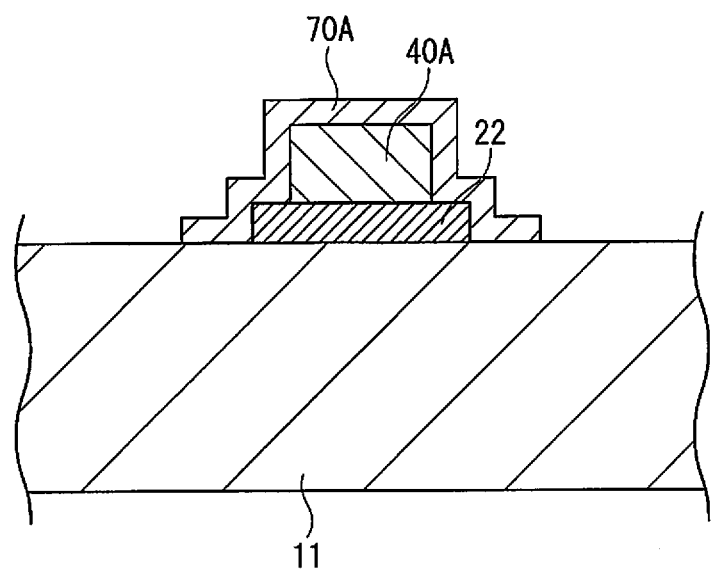
FIG. 8 is a cross-section view along line B-B in FIG. 6.

FIG. 8 is a cross-section view along line B-B in FIG. 6; In the piezoelectric element, a second piezoelectric layer 40A having a width dimension that is smaller than that of the lower electrode wire part 22 is provided on the lower electrode wire part 22. Also, as shown in FIGS. 6 and 7, an auxiliary electrode layer 70A is provided on the lower electrode wire part 22 as a wiring layer covering the second piezoelectric layer 40A.

Therefore, as shown in FIG. 8, the auxiliary electrode layer 70A is also in contact with the lower electrode wire part 22 along an outer peripheral edge of the second piezoelectric layer 40A. The auxiliary electrode layer 70A and the lower electrode wire part 22 thereby form a tube-shaped wiring structure provided with the second piezoelectric layer 40A at a center, and it becomes possible to further reduce the electrical resistance in the lower electrode wire part 22.

Third Embodiment

Next, a piezoelectric element according to a third embodiment of the present invention will now be described with reference to the accompanying drawings.

Figure 9A:
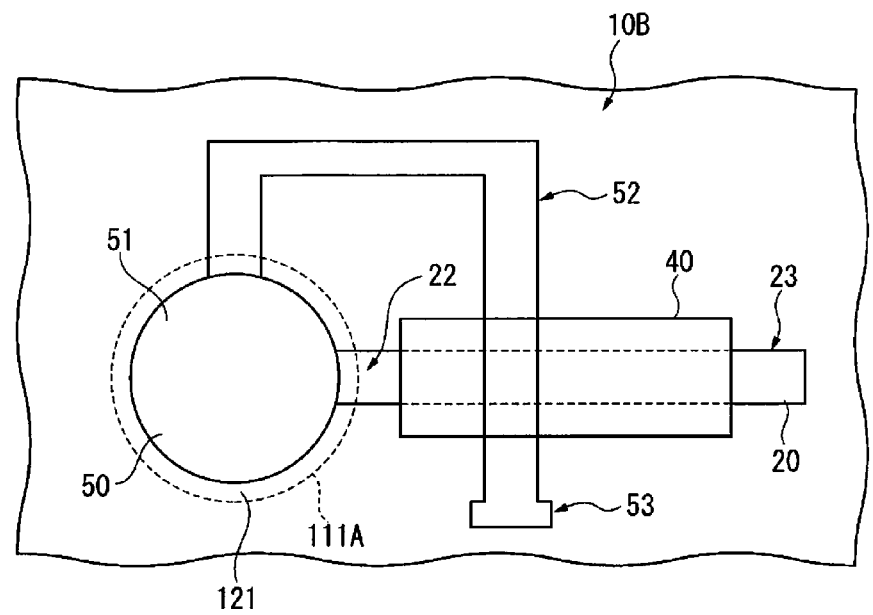
FIGS. 9A and 9B are views showing a piezoelectric element according to a third embodiment of the present invention, where
Figure 9B:
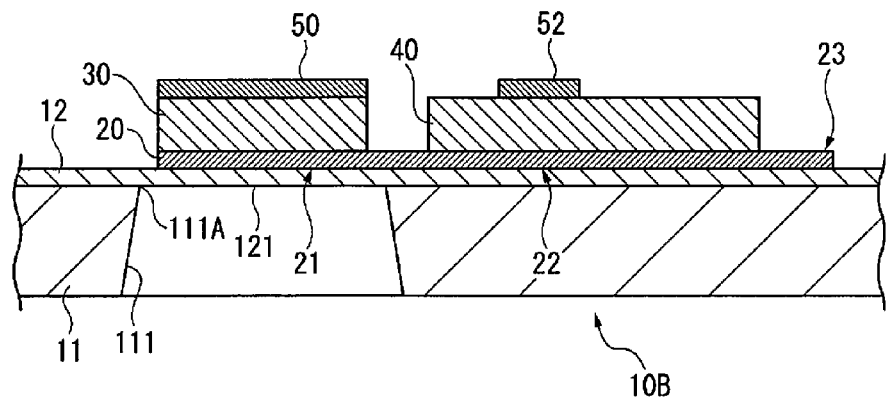

FIGS. 9A and 9B are views showing the piezoelectric element according to the third embodiment, where FIG. 9A is a plan view and FIG. 9B is a cross-section view.

While the piezoelectric element 10A according to the second embodiment shows an example in which the auxiliary electrode layer 70 connected to the lower electrode layer 20 is provided on a layer above the second piezoelectric layer 40, in the piezoelectric element 10B, the upper electrode wire part 52 is formed on a layer above the second piezoelectric layer 40.

In the piezoelectric element 10B according to the third embodiment as described above, the second piezoelectric layer 40 is made to function as an insulating layer, thereby making it possible to use a simple configuration to form a wiring pattern in which the lower electrode layer 20 and the upper electrode layer 50 cross each other.

Specifically, in an instance in which the piezoelectric element 10B is formed so as to be disposed in, e.g., an array, there are instances in which the arrangement of elements on an array substrate require the lower electrode wire part 22 and the upper electrode wire part 52 to be formed so as to cross each other. In such an instance, conventionally, it has been necessary to form an insulating layer separately in order to prevent the lower electrode wire part 22 and the upper electrode wire part 52 from coming into contact with each other. In contrast, in the piezoelectric element 10B according to the third embodiment, the upper electrode wire part 52 is formed on the second piezoelectric layer 40, thereby making it possible for the upper electrode wire part 52 and the lower electrode wire part 22 to cross each other without separately forming an insulating layer.

Fourth Embodiment

Next, as a fourth embodiment of the present invention, a description will be given for an ultrasound sensor provided with a piezoelectric element such as those described above, with reference to the accompanying drawings.

Figure 10:
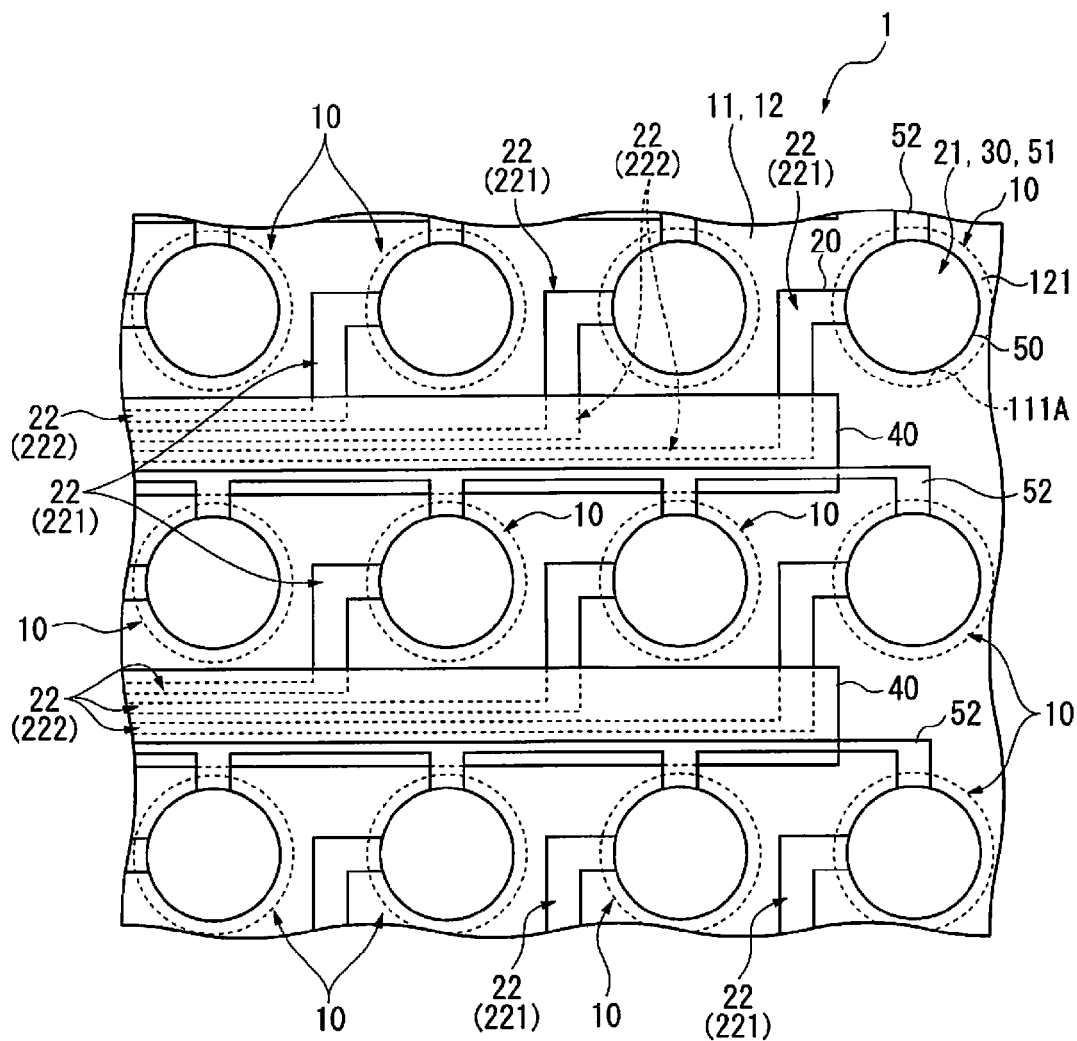
FIG. 10 is a plan view showing a part of an ultrasound sensor according to a fourth embodiment of the present invention.

FIG. 10 is a plan view showing a part of the ultrasound sensor according to the fourth embodiment.

In FIG. 10, the ultrasound sensor 1 is a piezoelectric sensor according to the present invention and has an array structure in which a plurality of piezoelectric elements 10 are arranged in a lattice shape.

An ultrasound sensor 1 of such description makes it possible to control the timing of ultrasound output from the piezoelectric elements 10 to focus the ultrasound onto a desired point. Although the present embodiment shows an example of an ultrasound transmission array in which a plurality of piezoelectric elements 10 for ultrasound transmission are arranged on the substrate 11, the piezoelectric element 10 may also be made to function as, e.g., ultrasound-receiving elements. In such an instance, a possible configuration is one in which, e.g., half of the piezoelectric elements 10 arranged in a lattice shape are made to function as ultrasound-transmitting elements, and the remaining half are made to function as ultrasound-receiving elements. Another possible configuration is one in which the piezoelectric elements 10 are made to function as ultrasound-transmitting elements and made to transmit ultrasound, after which the piezoelectric elements 10 are made to function as ultrasound-receiving elements and made to receive reflected ultrasound. Also, while an ultrasound sensor is shown as an example of a piezoelectric sensor, the piezoelectric sensor may be used as, e.g., pressure-detecting sensor for measuring contact pressure when a contacting object comes into contact with a piezoelectric sensor, or a sensor in which each of the piezoelectric elements 10 is sequentially driven, thereby imparting a driving force to the contacting object.

According to an ultrasound sensor 1 of such description, the timing of transmission of ultrasound outputted from each of the piezoelectric element 10 is varied, thereby causing ultrasound to be focused on a desired position. Therefore, each of the piezoelectric elements 10 is provided with a lower electrode wire part 22 that is independent of each other.

Specifically, as shown in FIG. 10, in each of the piezoelectric elements 10, the lower electrode wire part 22 connects to the lower main electrode body 21, and comprises an element connection wiring 221 formed across an interior and an exterior of the membrane 121, and a lower electrode wiring 222 for providing a connection between the element connection wiring 221 and the lower electrode terminal part 23. Since a plurality of lower electrode wirings 222 are formed between the respective membrane 121 of each of the piezoelectric elements 10, reasons related to layout dictate that each of the lower electrode wirings 222 be formed so as to have a smaller line width dimension than the element connection wiring 221. Therefore, the lower electrode wiring 222 has a larger electrical resistance than the lower electrode wiring 222. In the ultrasound sensor 1 of such description, in an instance in which the lower electrode wiring 222 is subjected to over-etching when the piezoelectric body and the upper electrode layer 50 in each of the piezoelectric element 10 are being formed, the electrical resistance increases further, and there is a need to apply a high voltage for the piezoelectric element 10 to output ultrasound having a desired sound pressure. In such an instance, drive control of the piezoelectric element 10 becomes difficult, particularly in the high-frequency region. However, in the present embodiment, the second piezoelectric layer 40 is formed on the lower electrode wiring 222 where the line width dimension is smaller than in the element connection wiring 221. Therefore, the lower electrode wiring 222 is not subjected to over-etching during sensor manufacture, and the electrical resistance can be inhibited from increasing.

Also, according to the ultrasound sensor 1 of the present embodiment, as shown in, e.g., FIG. 10, the upper electrode wire part 52 is formed so as to be used jointly by each of the piezoelectric elements 10 arranged along one direction (i.e., the lateral direction as seen in FIG. 10).

As with the third embodiment, the upper electrode wire part 52 is formed on the second piezoelectric layer 40. Therefore, it is possible to form a wiring pattern in which the upper electrode wire part 52 and the lower electrode wiring 222 are in close proximity to each other with respect to a plan view without causing the upper electrode wire part 52 and the lower electrode wiring 222 to come into contact with each other. A configuration of such description makes it possible to reduce a spacing between each of the arranged piezoelectric elements 10, and to reduce the size of the substrate 11 of the ultrasound sensor 1.

Also, in the example shown in FIG. 10, each of the lower electrode wirings 222 and the upper electrode wire parts 52 is disposed so as to not overlap in the plan view. The upper electrode wire part 52 and the lower electrode wiring 222 may be provided at overlapping positions, e.g., in the plan view.

The present embodiment showed an example in which the upper electrode wire part 52 is used jointly by a plurality of piezoelectric elements 10. However, the lower electrode wiring 222, for example, may be used jointly. In such an instance, the lower electrode wiring 222 can be formed so as to have a larger line width dimension, and providing the second piezoelectric layer 40 makes it possible to prevent the lower electrode wiring 222 from being subjected to over-etching during manufacture. It is therefore possible to further reliably inhibit an increase in electrical resistance.

Operation and Effect of Fourth Embodiment

The ultrasound sensor 1 according to the fourth embodiment has an array structure in which a plurality of piezoelectric elements 10 are arranged. In an ultrasound sensor 1 of such description, in an instance in which the first swing shaft 22 is formed on the substrate 11, it is necessary to arrange a plurality of lower electrode wirings 222 between the piezoelectric elements 10, restricting the line width dimension of the lower electrode wiring 222, and increasing the electrical resistance. In the ultrasound sensor 1 of such description, in an instance in which the lower electrode wiring 222 is subjected to over-etching during manufacture, the electrical resistance may increase further, the sound pressure of the outputted ultrasound may decrease, and drive control in the high-frequency region may be difficult to perform. However, in the present embodiment, the second piezoelectric layer 40 is formed on the lower electrode wiring 222, thereby making it possible to prevent the lower electrode wiring 222 from being subjected to over-etching during manufacture, and to inhibit an increase in the electrical resistance.

Also, forming the upper electrode wire part 52 on the second piezoelectric layer 40 makes it possible to prevent the lower electrode wiring 222 and the upper electrode wire part 52 from coming into contact with each other. In addition, it becomes possible to form the lower electrode wiring 222 and the upper electrode wire part 52 so as to overlap with each other in the plan view, reduce the distance between each of the piezoelectric elements 10, and contribute towards reducing the size of the ultrasound sensor 1.

Fifth Embodiment

Next, as a fifth embodiment, a description will be given for an electronic device according to the present invention, provided with the piezoelectric element 10 such as those described above. In the firth embodiment, a PDA (i.e., personal data assistant) is used as an example of the electronic device.

Figure 11:
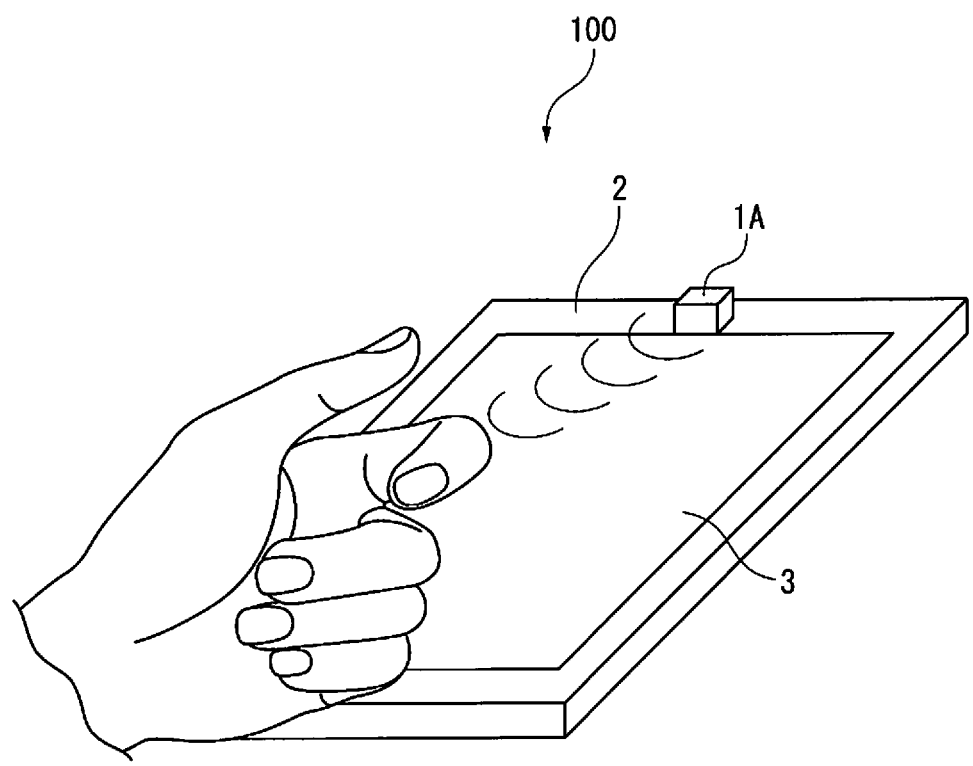
FIG. 11 is a schematic perspective view showing a configuration of a PDA according to a fifth embodiment.
Figure 12:
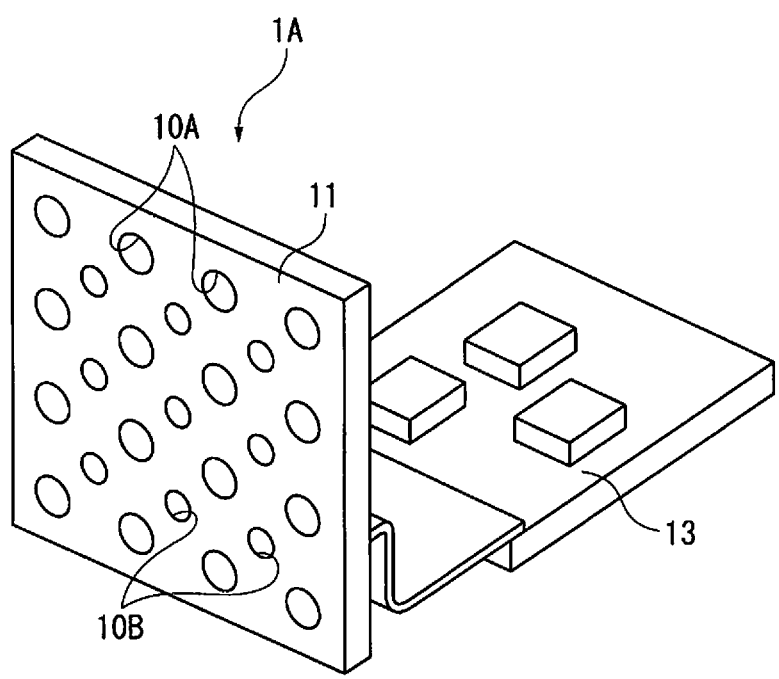
FIG. 12 is a schematic perspective view showing a configuration of an ultrasound sensor provided to the PDA.

FIG. 11 is a schematic perspective view showing a configuration of the PDA according to the fifth embodiment. FIG. 12 is a schematic perspective view showing a configuration of an ultrasound sensor provided to the PDA.

In FIG. 11, the PDA 100 has a main device body 2 and a display part 3. The display part 3 comprises, e.g., a liquid crystal panel or an organic panel, and connects to a calculation control part 13 (see FIG. 12) accommodated within the main device body 2. The display part 3 is configured so that the calculation control part 13 displays a variety of operational images and other information on the display part 3. An ultrasound sensor 1A, which is a piezoelectric sensor according to the present invention, is disposed on an outer periphery of the main device body 2. As shown in FIG. 12, the ultrasound sensor 1A comprises a plurality of piezoelectric elements 10A for transmitting ultrasound and a plurality of piezoelectric elements 10B for receiving ultrasound. As with the ultrasound sensor 1 in the fourth embodiment, the piezoelectric elements 10A, 10B are arranged in an array structure such as that shown in FIG. 10, and the second piezoelectric layer 40 is formed as a layer on a portion of the lower electrode wire part 22 that represents the lower electrode wiring 222 disposed in a region outside the membrane 121.

In the PDA according to the firth embodiment of such description, the second piezoelectric layer 40 is formed as a layer on a portion of the lower electrode wire part 22 that represents the lower electrode wiring 222 disposed in a region outside the membrane 121. Therefore, in the ultrasound sensor 1A of such description, the lower electrode wiring 222 is not subjected to over-etching during manufacture, and there are no increases in electrical resistance caused by the over-etching. Therefore, the piezoelectric elements 10A for ultrasound transmission are capable of transmitting ultrasound having a large sound pressure using a small driving voltage. The piezoelectric elements 10B for ultrasound transmission are capable of inhibiting attenuation of electrical signals produced by ultrasound reception. Specifically, it becomes possible for the ultrasound sensor 1A to transmit and receive ultrasound at a high degree of accuracy, and to reduce power consumption of the ultrasound sensor 1A.

The PDA provided with the ultrasound sensor 1A of such description is thereby capable of detecting a position of a finger or a touch-pen on the display part 3 to a high degree of accuracy, and of reducing power consumption.

In the fifth embodiment, an input device for the PDA 100 installed with the ultrasound sensor 1A is shown as an example of application of the piezoelectric element and the piezoelectric sensor according to the present invention; however, the application of the piezoelectric element and the piezoelectric sensor is not limited to that shown. For example, the piezoelectric element or the piezoelectric sensor of the present invention can be applied as an input device for, e.g., a portable game console, a mobile telephone, a PC, an electronic dictionary, or a similar device. The scope of application is not limited to input devices, and also includes, e.g., a cleaning device for cleaning a target object using ultrasound; a proximity sensor or a distance-measurement sensor installed in, e.g., a robot or a motor vehicle and used to measure a distance to a target object or a speed; a measurement sensor used for non-destructive inspection of pipes or for monitoring of flow speed of a fluid in a pipe; or any other device for performing a variety of processes using ultrasound output. The scope of use of the piezoelectric element or the piezoelectric sensor is not limited to transmitting and receiving ultrasound, and also includes, e.g., a Braille display device for displaying Braille using vibration of the membrane 121; or a driving device for driving, using vibration of the membrane 121, a target object that comes into contact with the membrane 121.

The embodiments described above are not intended to limit the scope of the present invention; any modification, improvement, or other change is included in the invention within a scope allowing the object of the present invention to be achieved.

For instance, there was given an example in which the second piezoelectric layer 40 is formed so as to cover a portion of the lower electrode layer 20 from the end part position 22A separated by a distance L from the edge part 111A of the opening part 111 to the part 22B where a connection is present between the lower electrode terminal part 23 and the lower electrode wire part 22. However, another possible configuration is one in which a portion between the edge part 111A of the opening part 111 and the connecting part 22B is covered. In such an instance, the resistance against deflection of the membrane 121 can still be reduced, compared to an instance in which, e.g., the second piezoelectric layer 40 is formed across the interior and the exterior of the opening part 111.

A configuration in which the second piezoelectric layer 40 is formed on a part of the edge part 111A of the opening part 111 is also possible. For example, the second piezoelectric layer 40 may be formed across the interior and the exterior of the opening part 111 so as to straddle the edge part 111A of the opening part 111 only where the lower electrode wire part 22 has been formed. In such an instance, no part of the lower electrode wire part 22 is exposed to an exterior; and it becomes possible to reliably prevent over-etching when the piezoelectric layer 60 and the upper electrode precursor layer 50A are etched, and suppress any increase in electrical resistance in an even more reliable manner. Also, compared to a configuration in which the second piezoelectric layer 40 is formed around the entire periphery of the edge part 111A of the opening part 111, resistance against deflection of the membrane 121 does not increase, and it is possible to produce ultrasound having a large sound pressure.

Another possible configuration is one in which the second piezoelectric layer 40 is not formed within a range of distance L from the edge part 111A of the opening part 111, within which range the second piezoelectric layer 40 may interfere with the vibration of the membrane 121, but is formed on all other regions.

Although in the present embodiment, there was shown by way of example a configuration in which the lower electrode layer 20 is formed on the supporting film 12, the configuration is not limited thereto. Another example of a possible configuration is one in which the supporting film 12 is subjected to etching; an insulating layer or another layer, for example, is layered on an etched portion; and the lower electrode layer 20 is formed on the other layer.

Although the present invention has been described in detail above with reference to preferred embodiments, the invention shall not be limited thereto. Specifically, the present invention was specifically illustrated and described, mainly in relation to specific embodiments; however, persons skilled in the art may perform any of a variety of modifications or improvements to the above embodiments provided that no departure is made from the technical concepts and objects of the invention.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A method for manufacturing a piezoelectric element comprising:
    patterning a lower electrode layer on a support body with the support body having a displacing part that is capable of undergoing displacement in a thickness direction, and the lower electrode layer having a lower main electrode body and a lower electrode wire part, the lower main electrode body being provided in a region inside an outer peripheral edge of the displacing part in a plan view when the support body is viewed in the thickness direction of the displacing part, and the lower electrode wire part being connected to the lower main electrode body and provided across a region outside and the region inside the outer peripheral edge of the displacing part;
    layering on the lower electrode layer a piezoelectric layer including a first piezoelectric layer and a second piezoelectric layer;
    performing an etching treatment outside a region in which the first piezoelectric layer is to be formed and a region in which the second piezoelectric layer is to be formed, and forming the first piezoelectric layer and the second piezoelectric layer so that the first piezoelectric layer is provided on the lower main electrode body in the region inside the outer peripheral edge of the displacing part in the plan view, and the second piezoelectric layer is provided on the support body so as to cover at least a part of the lower electrode wire part, the first piezoelectric layer being formed at a first position that does not overlap with the outer peripheral edge of the displacing part in the plan view;
    layering an upper electrode precursor layer; and
    performing etching and patterning of the upper electrode precursor layer so that an upper electrode layer is provided across the region outside and the region inside the outer peripheral edge of the displacing part in the plan view, at least a part of the upper electrode layer being layered on the first piezoelectric layer and insulated from the lower electrode layer.

* * * * *